(12) United States Patent
Nishimura et al.

(10) Patent No.: US 8,962,489 B2
(45) Date of Patent: Feb. 24, 2015

(54) METHOD FOR ETCHING FILM CONTAINING COBALT AND PALLADIUM

(71) Applicant: Tokyo Electron Limited, Tokyo (JP)

(72) Inventors: Eiichi Nishimura, Miyagi (JP); Masato Kushibiki, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 14/217,652

(22) Filed: Mar. 18, 2014

(65) Prior Publication Data

US 2014/0287591 A1 Sep. 25, 2014

(30) Foreign Application Priority Data

Mar. 19, 2013 (JP) ................. 2013-056584

(51) Int. Cl.
*H01L 21/302* (2006.01)
*H01L 21/3065* (2006.01)

(52) U.S. Cl.
CPC .................. *H01L 21/3065* (2013.01)
USPC ............. 438/714; 216/37; 438/623; 438/637; 438/761; 438/778

(58) Field of Classification Search
USPC ............. 216/37; 438/623, 637, 714, 761, 778
See application file for complete search history.

(56) References Cited

U.S. PATENT DOCUMENTS

2007/0023790 A1* 2/2007 Ohnuma et al. .............. 257/267

FOREIGN PATENT DOCUMENTS

JP 2011-14881 A 1/2011

* cited by examiner

*Primary Examiner* — Duy Deo
*Assistant Examiner* — Maki Angadi
(74) *Attorney, Agent, or Firm* — Rothwell, Figg, Ernst & Manbeck, P.C.

(57) ABSTRACT

Disclosed is a method for etching a film contains cobalt and palladium is provided. A hard mask is provided on the film. The method film includes a process "a" of etching the film by ion sputter etching, a process "b" of exposing a workpiece to plasma of a first gas containing halogen elements after the process "a" of etching of the film, a process "c" of exposing the workpiece to plasma of a second gas containing carbons after the process "b" of exposing the workpiece to the plasma of the first gas, and a process "d" of exposing the workpiece to plasma of a third gas containing a noble gas after the process "c" of exposing the workpiece to the plasma of the second gas. In the method, a temperature of a placement table on which the workpiece is placed is set to a first temperature of 10° C. or less in the process "a", process "b" and process "c".

4 Claims, 13 Drawing Sheets

METHOD FOR ETCHING FILM CONTAINING COBALT AND PALLADIUM

CROSS-REFERENCE TO RELATED APPLICATIONS

This application is based on and claims priority from Japanese Patent Application No. 2013-056584 filed on Mar. 19, 2013 with the Japan Patent Office, the disclosure of which is incorporated herein in its entirety by reference.

TECHNICAL FIELD

Various aspects and embodiments of the present disclosure are related to a method for etching a film containing cobalt and palladium.

BACKGROUND

Plasma etching has been used for etching a film made of a semiconductor material in manufacturing electronic devices. A workpiece may be exposed to processing gas plasma so as to etch a film to be etched physically and chemically in plasma etching.

Further, an electronic device may include a film made of a hard-to-etch material, and the hard-to-etch material is needed to be patterned by the plasma etching as well. For example, an MRAM element provided with a film containing cobalt (Co) and palladium (Pd) (hereinafter, referred to as "CoPd film") as a kind of a hard-to-etch material is described in Japanese Patent Laid-Open Publication No. 2011-14881. Further, an etching method in which plasma of a mixed gas containing a hydrocarbon gas and an inert gas is generated, a temperature of the CoPd film is set to 250° C. or less, and ions are attracted onto the CoPd film to etch the CoPd film is described in Japanese Patent Laid-Open Publication No. 2011-14881.

As described in Japanese Patent Laid-Open Publication No. 2011-14881, the CoPd film is patterned by the so-called ion sputter etching. However, the hard mask used in etching of the CoPd film has a low selectivity for the ion sputter etching of the CoPd film. Accordingly, verticality of a lateral surface of the hard mask during a time period until etching of the CoPd film is completed is remarkably reduced in the method described in Japanese Patent Laid-Open Publication No. 2011-14881. Further, constituent materials of the film having been sharpened by the ion sputter etching are reattached to the hard mask and a lateral surface of the film formed by the etching.

Therefore, a technique in which a film containing cobalt and palladium may be etched while suppressing degradation of verticality of a lateral surface of a hard mask and a deposit reattached to a workpiece is removed is needed in the present technical field.

SUMMARY

According to an aspect of the present disclosure, there is provided a method for etching a film, which contains cobalt and palladium, of a workpiece. A hard mask is provided on the film. The method includes: a process of etching the film by the ion sputter etching; exposing a workpiece to plasma of a first gas containing halogen elements after the etching of the film; exposing the workpiece to plasma of a second gas containing carbon after the exposing of the workpiece to the plasma of the first gas; and exposing the workpiece to plasma of a third gas containing a noble gas after the exposing of the workpiece to the plasma of the second gas. In the method, a temperature of a placement table on which the workpiece is placed is set to a first temperature of 10° C. or less in the etching of the film, the exposing of the workpiece to the plasma of the first gas and the exposing of the workpiece to the plasma of the second gas, and the temperature of the placement table on which the workpiece is placed is set to a second temperature higher than the first temperature in the exposing of the workpiece to the plasma of the third gas.

The foregoing summary is illustrative only and is not intended to be in any way limiting. In addition to the illustrative aspects, exemplary embodiments, and features described above, further aspects, exemplary embodiments, and features will become apparent by reference to the drawings and the following detailed description.

DETAILED DESCRIPTION

Figure 1:
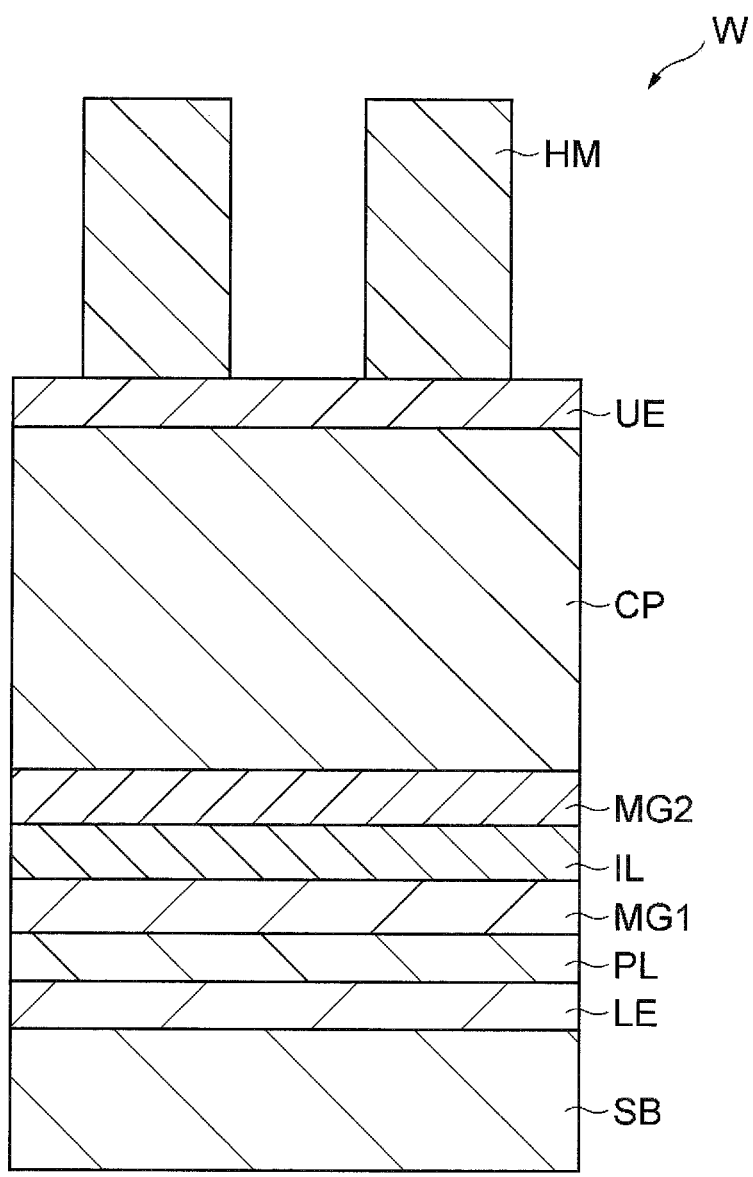
FIG. 1 is a view illustrating an example of a workpiece including a film containing cobalt and palladium.

In the following detailed description, reference is made to the accompanying drawing, which form a part hereof. The illustrative exemplary embodiments described in the detailed description, drawing, and claims are not meant to be limiting. Other exemplary embodiments may be utilized, and other changes may be made without departing from the spirit or scope of the subject matter presented here.

According to an aspect of the present disclosure, there is provided a method for etching a film, which contains cobalt and palladium, of a workpiece. A hard mask is provided on the film. The method includes (a) etching the film by the ion sputter etching (hereinafter, referred to as a process "a"), (b) exposing a workpiece to plasma of a first gas containing halogen elements after the etching of the film (hereinafter, referred to as a process "b"), (c) exposing the workpiece to plasma of a second gas containing carbon after the exposing of the workpiece to the plasma of the first gas (hereinafter, referred to as a process "c"), and (d) exposing the workpiece to plasma of a third gas containing a noble gas after the exposing of the workpiece to the plasma of the second gas (hereinafter, referred to as a process "d"). In the method, a temperature of a placement table on which the workpiece is placed is set to a first temperature of 10° C. or less in the process "a", process "b" and process "c". Further, the temperature of the placement table on which the workpiece is placed is set to a second temperature higher than the first temperature in the process "d". In the exemplary embodiment, the process "d" may be performed without exposing the workpiece to atmosphere after the processes "a", "b" and "c" are sequentially repeated. Further, the film containing cobalt and palladium may be either a multilayer film in which a cobalt layer and a palladium layer are alternately provided or a film made of an alloy formed of cobalt and palladium. Hereinafter, the film containing cobalt and palladium is referred to as a "CoPd film".

In the method according to the aspect of the present disclosure, the CoPd film is sharpened by an ion sputter etching on a placement table of which temperature is set to a low temperature of 10° C. or less in the process "a". It is possible to suppress verticality of the lateral surface of the hard mask from being degraded according to the ion sputter etching performed at such temperature. Further, in this method, a deposit attached to the hard mask and a lateral surface of the film formed by etching is halogenated in the process "b" and the workpiece is exposed to plasma of the gas containing carbon in the process "c". Accordingly, even when the temperature of the placement table is set to 10° C. or less, the deposit may be partially removed. Further, the reason why the deposit may be partially removed is supposed that crystallinity of deposit becomes low due to setting the temperature of the placement table to 10° C. or less in the processes "a" and "b". Further, in the method, the workpiece is exposed to plasma of a third gas, on a placement table of which temperature is set to a second temperature which is relatively high. Accordingly, it is possible to remove the deposit which is left partially.

In an exemplary embodiment, the first temperature is 10° C. or less. The workpiece is disposed on the placement table of which temperature is set to such a temperature to perform the processes "a", "b" and "c" and thus, it becomes possible to further suppress the verticality of the lateral surface of the hard mask from being degraded.

In an exemplary embodiment, the third gas may further contain a hydrogen gas. The workpiece is exposed to the plasma of the gas containing carbon in the process "c" and thus, a film containing carbon may be formed on the workpiece. Hydrogen is contained in the third gas and thus, it becomes possible to remove the film, which contains carbon, formed on the workpiece.

As described above, the film including cobalt and palladium may be etched while suppressing degradation of the verticality of the lateral surface of the hard mask and also, it becomes possible to remove the deposit reattached to the workpiece.

Hereinafter, various embodiments will be described in detail with reference to accompanying drawings. Further, like reference numerals are given to the same or substantially the same elements in respective drawings.

First, a workpiece to which a method of etching a film containing cobalt and palladium (hereinafter, referred to as a "CoPd film") according to an exemplary embodiment may be applied will be described. FIG. 1 is a view illustrating an example of a workpiece W including a CoPd film. In FIG. 1, a cross section of the workpiece W used for manufacturing an MRAM element is illustrated. The workpiece (hereinafter, referred to as "wafer") W includes a substrate SB, a lower electrode layer LE, a pinning layer PL, a first magnetic layer MG1, an insulation layer IL, a second magnetic layer MG2, a CoPd film CP, an upper electrode layer UE and a hard mask HM.

The lower electrode layer LE is provided on the substrate SB and may be made of, for example, Ti (titanium). The pinning layer PL is provided on the lower electrode layer LE. The pinning layer PL is made of anti-ferromagnetic material and may be made of, for example, IrMn or PtMn. The first magnetic layer MG1, the insulation layer IL and the second magnetic layer MG2 that constitute MTJ (Magnetic Tunnel Junction) are sequentially laminated on the pinning layer PL. The first magnetic layer MG1 and the second magnetic layer MG2 may be made of, for example, CoFeB. Further, the insulation layer IL may be made of MgO or Al2O3.

The CoPd film CP is provided on the second magnetic layer MG2. The CoPd film CP of the wafer W illustrated in FIG. 1 is a multilayer film formed of a Co layer and a Pd layer that are alternately laminated. The upper electrode layer UE is provided on the CoPd film CP. The upper electrode layer UE may be made of, for example, Ru. Further, the hard mask HM is provided on the upper electrode layer UE. The hard mask HM is a mask for etching the upper electrode layer UE and the CoPd film and may be made of, for example, W (tungsten). Further, the hard mask HM may be made of, such as Ta or TiN.

Figure 2:
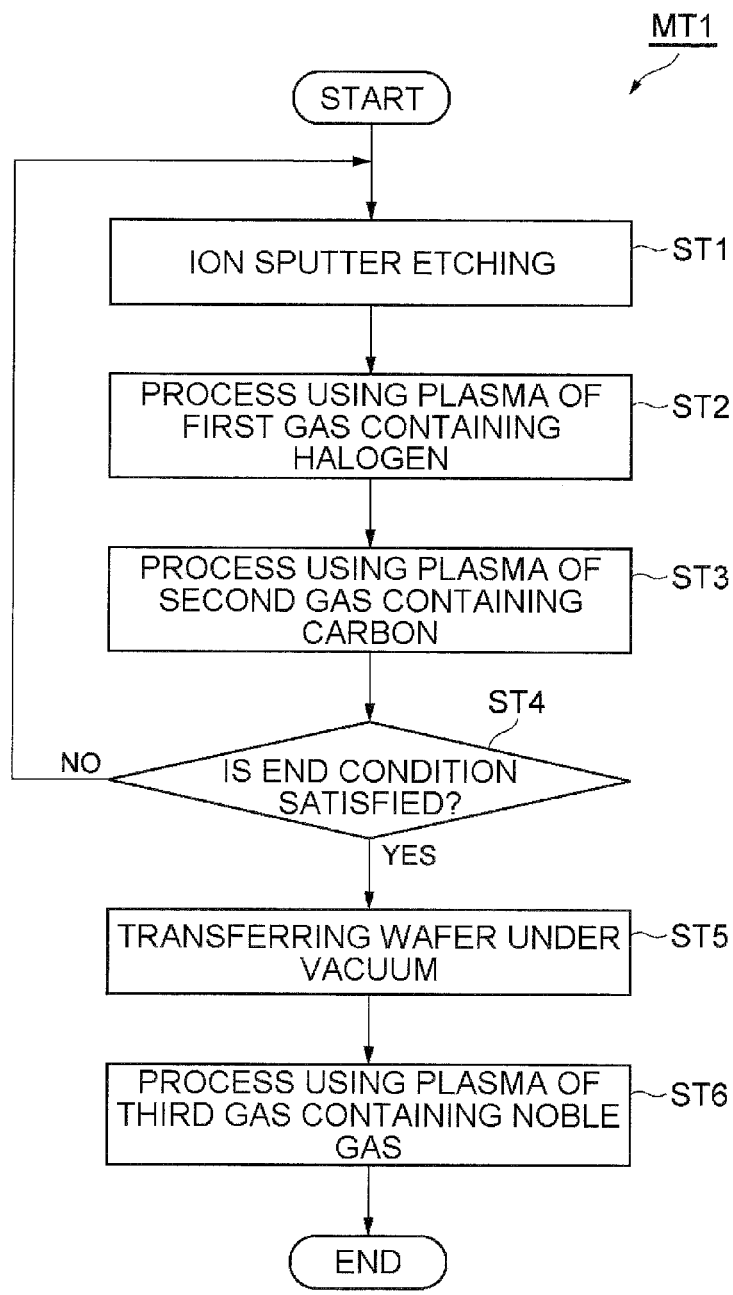
FIG. 2 is a flowchart illustrating a method of etching the film containing cobalt and palladium according to an exemplary embodiment of the present disclosure.

Hereinafter, a method of etching the CoPd film according to an exemplary embodiment will be described by way of an example regarding the wafer W illustrated in FIG. 1 as an object to which the method is applied. FIG. 2 is a flowchart illustrating a method of etching the film containing cobalt and palladium according to the exemplary embodiment. Hereinafter, a method MT1 illustrated in FIG. 2 will be described with reference to FIG. 3 to FIG. 7 together with FIG. 2. FIG. 3 to FIG. 7 are views illustrating respective processes of the method indicated in FIG. 2.

Figure 3:
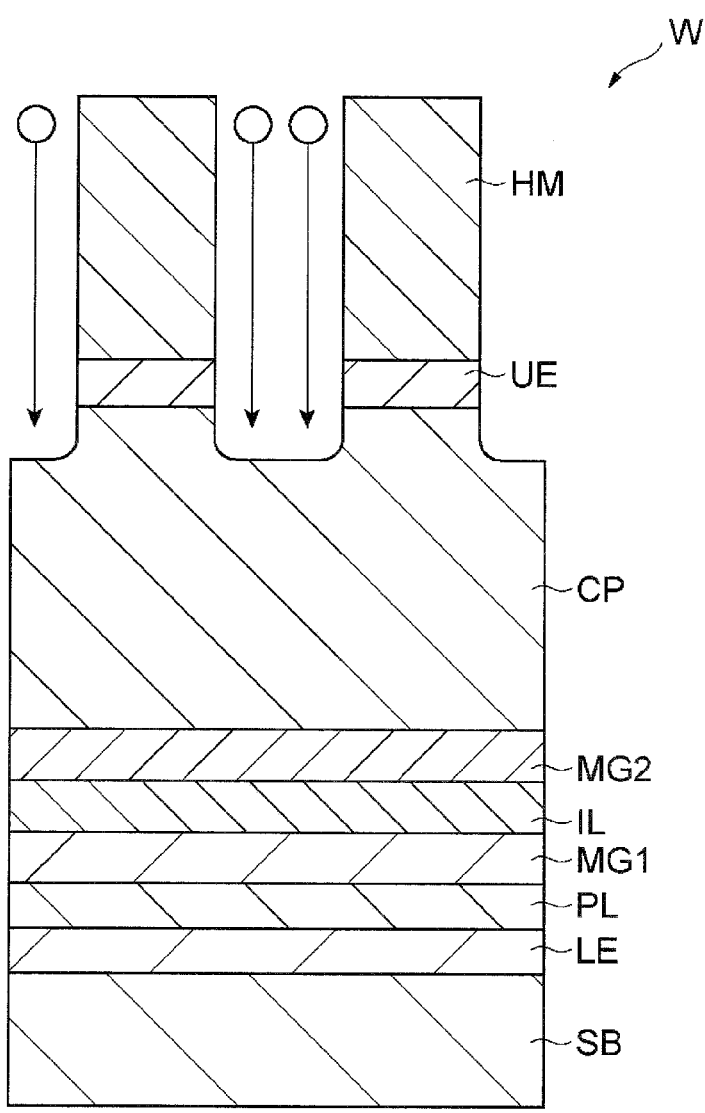
FIG. 3 is a view illustrating each process of the method indicated in FIG. 2.

First, process ST1 is performed in the method MT1. At process ST1, the CoPd film CP is etched through an ion sputter etching in a processing container of a plasma processing apparatus. At process ST1, plasma of a noble gas, for example, an Ar gas, is generated and ions in the plasma are attracted onto the wafer W by a bias power as illustrated in FIG. 3. In FIG. 3, a circle drawn on a base end of arrow indicates ions. As such, the CoPd film CP is physically etched as ions are attracted onto the wafer W at process ST1. Process ST1 is performed in a state where the temperature of the placement table on which the wafer W is disposed is set to 10° C. or less. In an exemplary embodiment, the temperature of the placement table at process ST1 may be −10° C. or less.

Further, etching of the upper electrode layer UE may be performed similarly to the etching of the CoPd film CP. Accordingly, process ST1 performed for the first time may serve as a process for etching the upper electrode layer UE.

Figure 4:
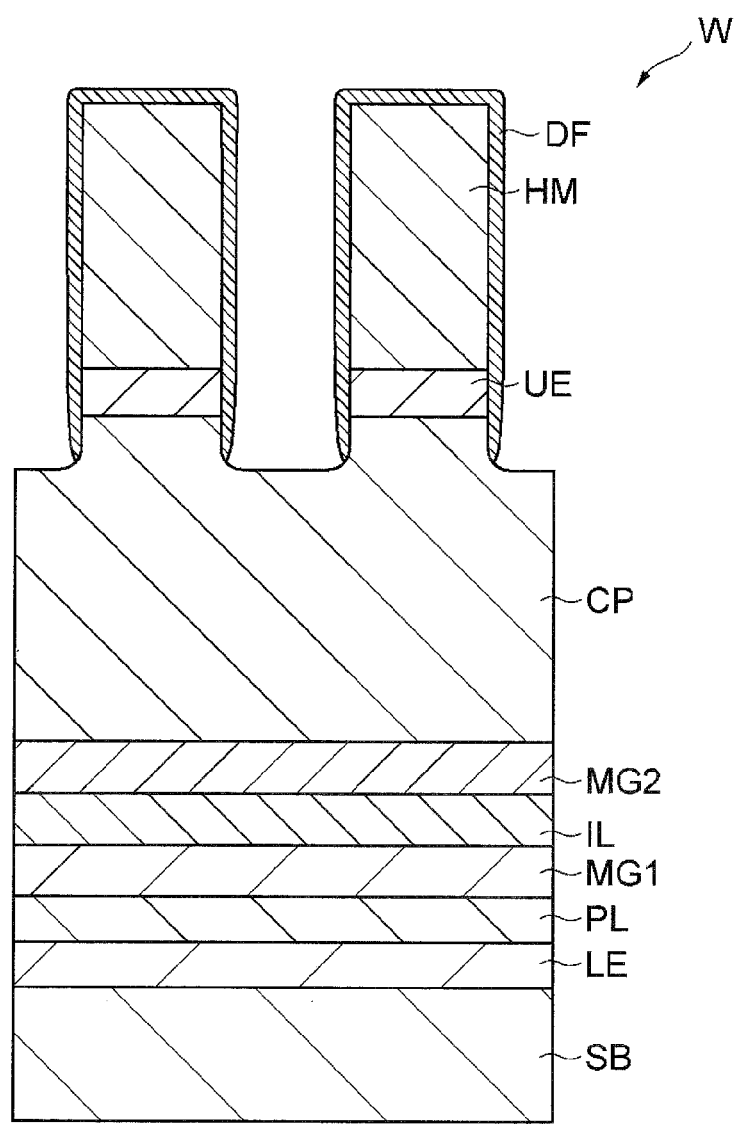
FIG. 4 is a view illustrating each process of the method indicated in FIG. 2.

When the CoPd film CP is etched through process ST1, as illustrated in FIG. 4, etched residue of the film CP forms a deposit DF to be attached to a surface of the hard mask HM, a lateral surface of the upper electrode layer UE and the lateral surface of the CoPd film CP formed by etching. In the method MT1, process ST2 and process ST3 are performed in order to partially remove the deposit DF formed at process ST1 as illustrated in FIG. 2.

At process ST2, the wafer W is exposed to the plasma of the first gas in the processing container of the plasma processing apparatus. The first gas may contain halogen elements. For example, the first gas may contain an NF3 gas. Process ST2 is also performed in a state where the temperature of the placement table on which the wafer W is disposed is set to 10° C.

or less. In an exemplary embodiment, the temperature of the placement table for process ST2 may be −10° C. or less.

In addition, the first gas may contain carbon in order to suppress etching of the hard mask HM. For example, the first gas may contain a methane gas. Accordingly, a carbon-based protective film is formed on a surface of the hard mask HM and thus, the hard mask HM may be suppressed from being etched.

Figure 5:
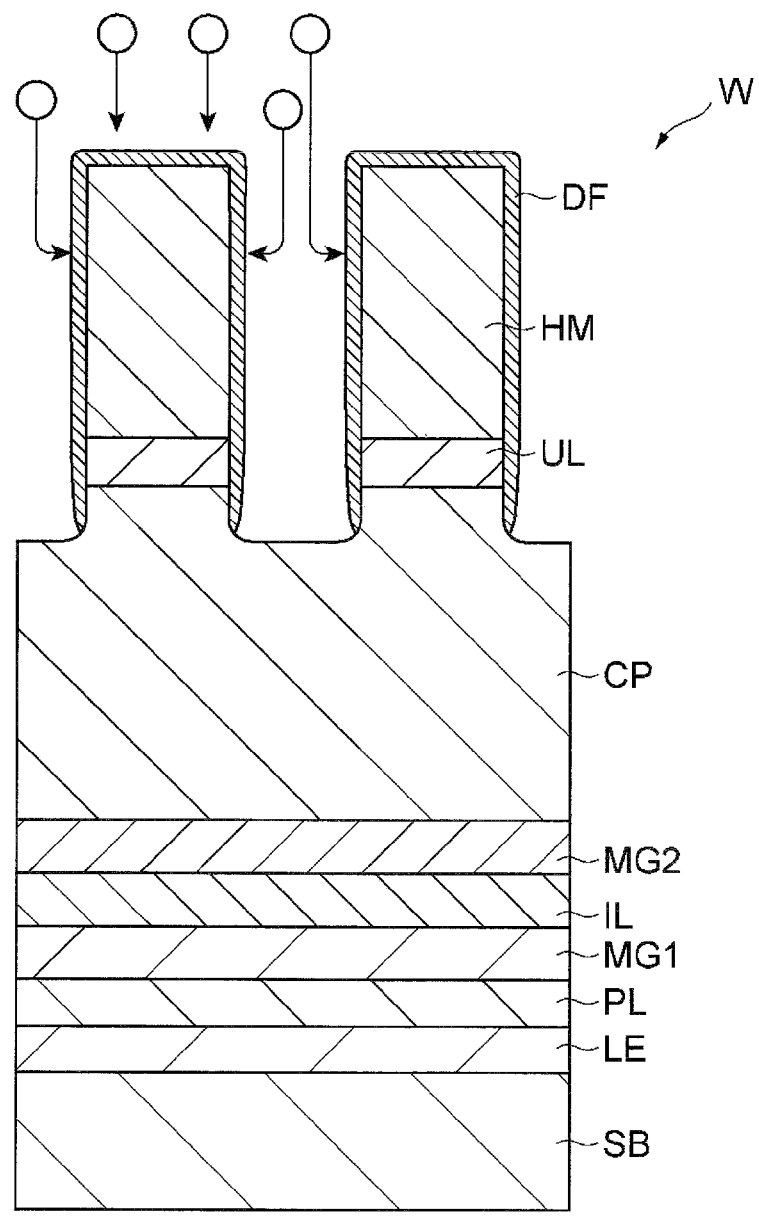
FIG. 5 is a view illustrating each process of the method indicated in FIG. 2.

When process ST2 is performed, active species of halogen elements or molecules containing halogen elements is produced and the deposit DF is exposed to the active species as illustrated in FIG. 5. In FIG. 5, a circle drawn on a base end of arrow indicates the active species. As the result of process ST2, the deposit DF is halogenated and the deposit DF is changed into a halogenated deposit DFX as illustrated in FIG. 6.

As illustrated in FIG. 2, subsequently, process ST3 is performed in the method MT1. At process ST3, the wafer W is exposed to plasma of a second gas within the processing container of the plasma processing apparatus. The second gas may contain carbon. For example, the second gas may contain a methane gas. Further, the second gas may contain other gases, for example, CxFY such as CHF3, CH2F2, CH3F, C4F6, CO, or CO2, instead of a methane gas, or in addition thereto. Process ST3 is also performed in a state where the temperature of the placement table on which the wafer W is placed is set to a first temperature of 10° C. or less. In an exemplary embodiment, the temperature of the placement table at process ST3 may be −10° C. or less.

In an exemplary embodiment, the second gas may contain a hydrogen gas. As described above, the second gas contains carbon and thus, a carbon-based film may be formed on the surface of the wafer W. However, when an amount of carbon becomes excessive, the film is excessively formed. The hydrogen gas is added to the second gas so as to dilute carbon in the second gas and thus, the excessive film formation is suppressed.

Figure 6:
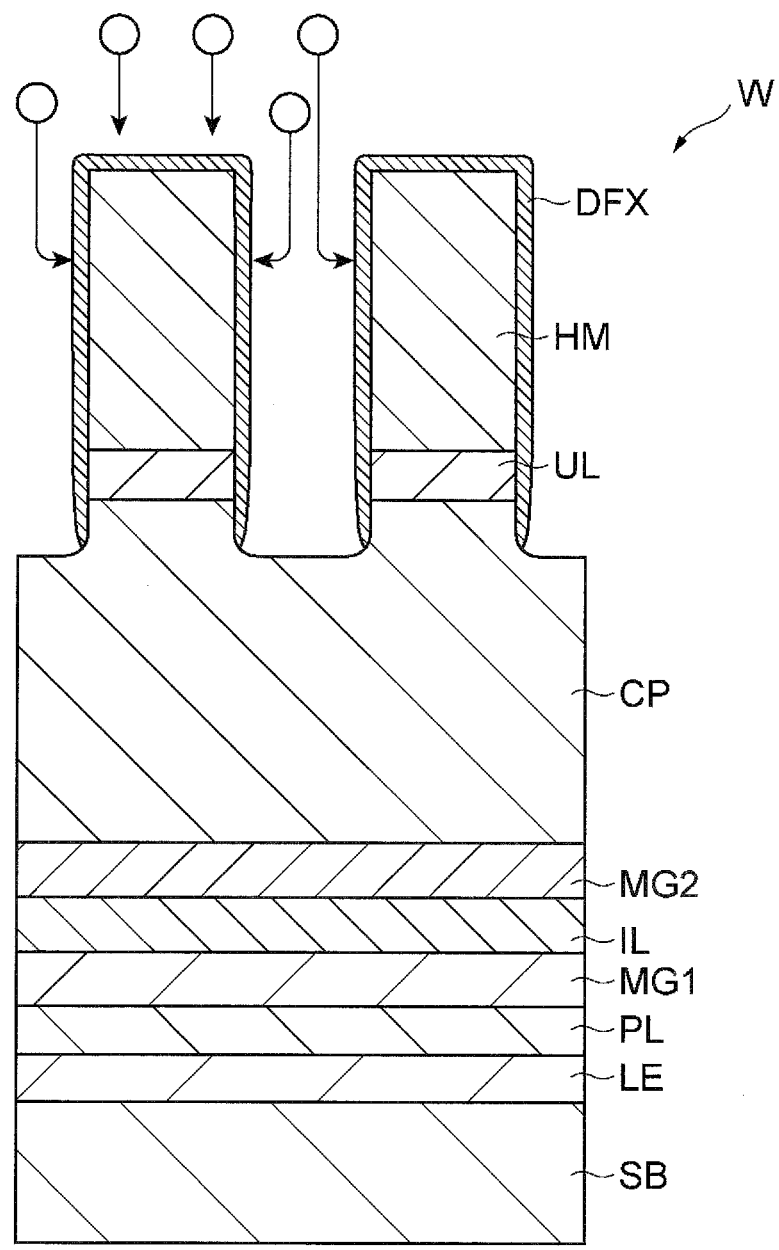
FIG. 6 is a view illustrating each process of the method indicated in FIG. 2.

When process ST3 is performed, active species of carbon or molecules containing carbons are produced and the deposit DF is exposed to the active species as illustrated in FIG. 6. In FIG. 6, a circle drawn on a base end of arrow indicates the active species. As the result of process ST3, the deposit DFX is partially removed.

Referring back to FIG. 1, it is determined whether an end condition is satisfied at process ST4 in MT1 method according to the exemplary embodiment. The end condition is, for example, an upper limit on the number of times that processes ST1 to ST3 are repeated. When it is determined that the end condition is not satisfied, a process starting from process ST1 is performed again. In the meantime, when the end condition is satisfied, method MT1 proceeds to a process for removing the deposit partially left.

In the exemplary embodiment, the wafer W is transferred to a separate plasma processing apparatus through a vacuum transfer system in order to process the wafer W within a processing container of the separate plasma processing apparatus after repeating the cycle of processes ST1 to ST3 (process ST5). Processes ST1 to ST3 are performed at a low temperature of 10° C. or less and thus, when the wafer W is transferred in an atmosphere, dew condensation may be formed on the wafer W. In the meantime, the wafer W may be transferred through the vacuum transfer system so as to prevent the wafer W from being dew condensed.

Subsequently, process ST6 is performed in MT1. At process ST6, the wafer W is exposed to plasma of a third gas within the processing container of the separate plasma processing apparatus. The third gas may contain a noble gas such as Ar. At process ST6, the temperature of the placement table on which the placement table is placed is set to a second temperature higher than the first temperature. The second temperature is preferably 100° C. or more and otherwise, may be 200° C.

In an exemplary embodiment, the third gas may contain the hydrogen gas. As described above, the carbon-based film used in the previous process may be left on the surface of the wafer W. The hydrogen gas may be added to the third gas to remove the carbon-based film.

Further, in an exemplary embodiment, a bias power for attracting ions onto the wafer W is not used in process ST6. That is, process ST6 may be performed in a bias-free state. Process ST6 is performed at a relatively high temperature and thus, process ST6 may be performed in a bias-free state to suppress the surface of the wafer W or the hard mask HM from being damaged.

Figure 7:
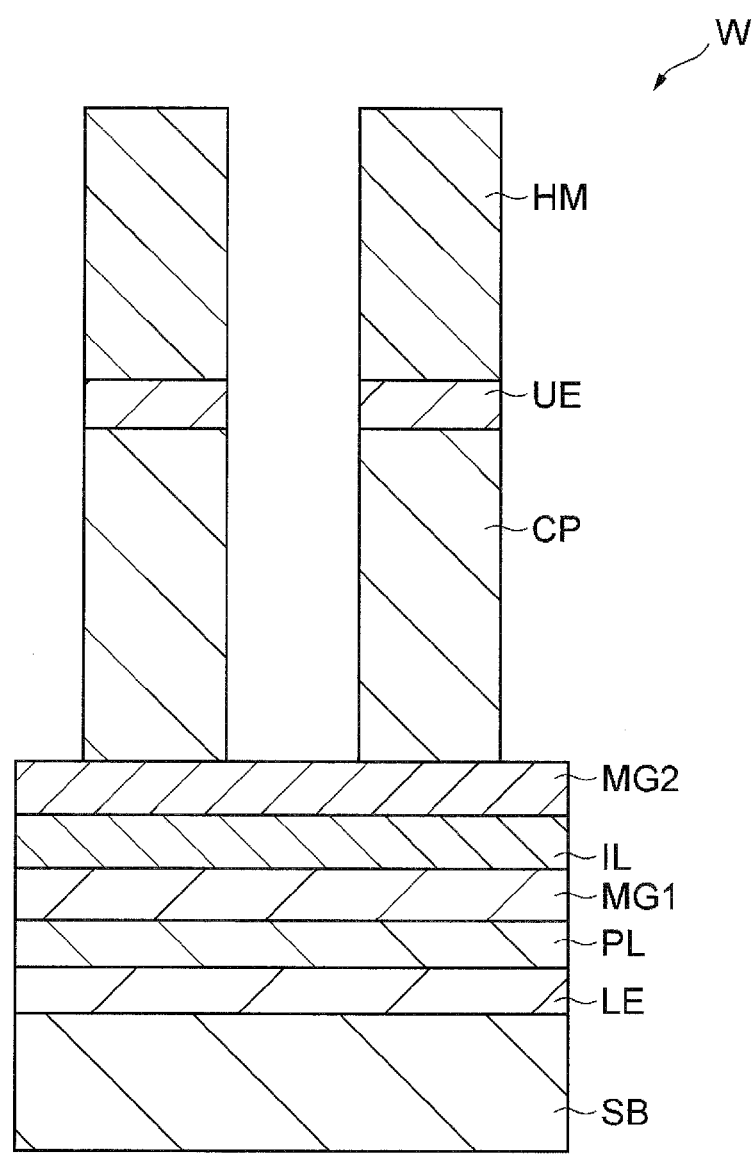
FIG. 7 is a view illustrating each process of the method indicated in FIG. 2.

When process ST6 is performed, the surface of the wafer W is exposed to active species of noble gas atoms, or in addition to this, active species of hydrogen. Accordingly, the deposit DFX attached to the surface of the wafer W is removed. As a result, an etched CoPd film CP is obtained as illustrated in FIG. 7.

As described above, at process ST1 of the method MT1, the temperature of the placement table is set to the first temperature of 10° C. or less. According to the ion sputter etching under the first temperature, etching of the hard mask HM is suppressed, and thus, degradation in verticality of the lateral surface of the hard mask HM may be suppressed. Further, when the first temperature is −10° C. or less, degradation in verticality of the lateral surface of the hard mask HM is further suppressed.

Further, in method MT1, the deposit DF is halogenated at process ST2 and the wafer W is exposed to the plasma of the second gas containing carbon at process ST3. Accordingly, even when the temperature of the placement table is set to 10° C. or less, the deposit DF may be partially removed. The reason the deposit DF may be partially removed is supposed that crystallinity of deposit DF (or DFX) becomes lower due to setting of the temperature of the placement table to 10° C. or less. Further, it is supposed that the deposit DF is halogenated to become a state that is easy to form a complex with molecules containing carbon. Accordingly, it is supposed that it becomes possible to remove the deposit DF even when the temperature of the placement table is set to the first temperature.

Further, at process ST6 of method MT1, the wafer W is disposed on the placement table set to a second temperature which is a relatively high temperature to be processed in order to remove the deposit partially left. Accordingly, the partially left deposit may be removed at processes ST1 to ST3 performed at the low temperature.

Figure 8:
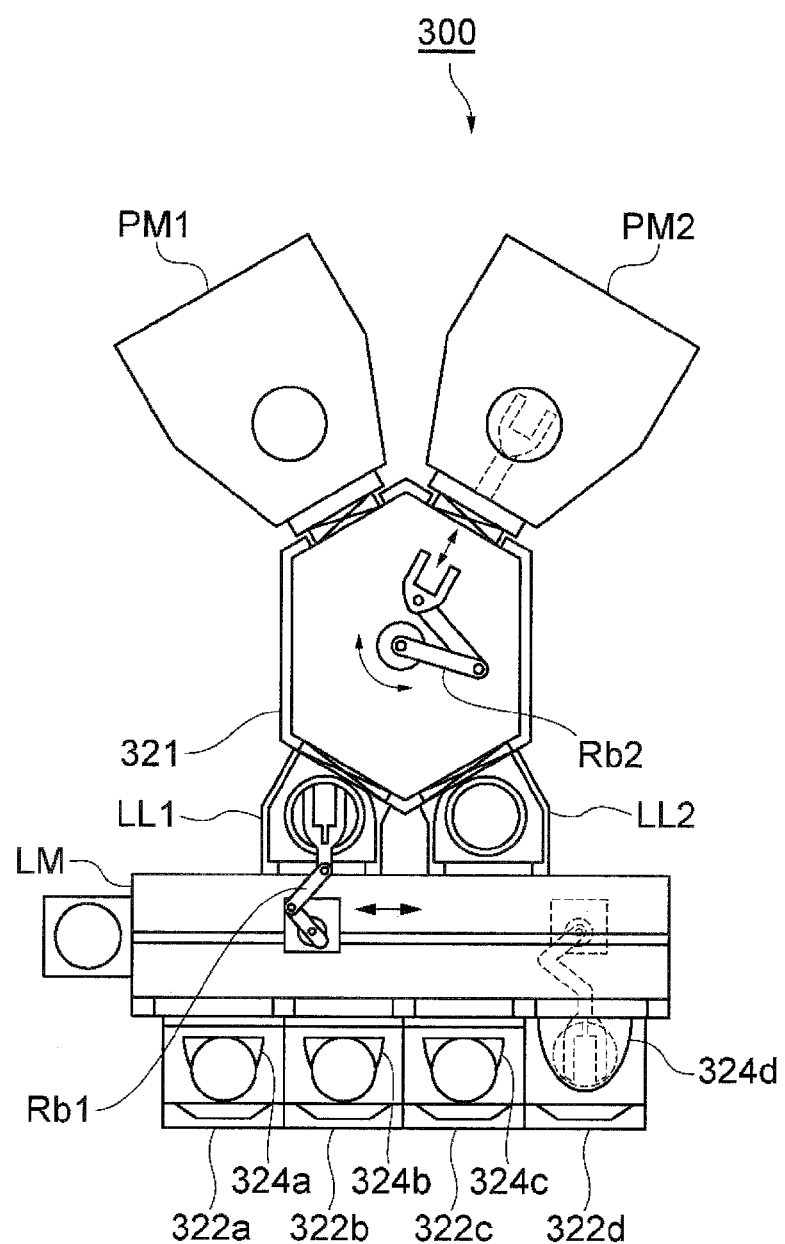
FIG. 8 is view schematically illustrating a processing system according to the exemplary embodiment.

Hereinafter, description will be made on a processing system that may be used in performing method MT1. FIG. 8 is view schematically illustrating a processing system according to an exemplary embodiment. A processing system 300 includes placement tables 322a to 322d, accommodating containers 324a to 324d, a loader module LM, load lock chambers LL1 and LL2, process modules PM1, PM2, PM3 and a transfer chamber 321.

The placement tables 322a to 322d are arranged along an edge of the loader module LM. The accommodating containers 324a to 324d are disposed above the placement tables 322a to 322d, respectively. The wafer W is accommodated within each of the accommodating containers 324a to 324d.

A transfer robot Rb1 is installed in the loader module LM. The transfer robot Rb1 takes out the wafer W accommodated in one of the accommodating containers 324a to 324d and transfers the wafer W into the load lock chamber LL1 or LL2.

The load lock chambers LL1 and LL2 is installed along another edge of the loader module LM, and constitute a preliminary depressurization chamber. The load lock chambers LL1 and LL2 are connected to the transfer chamber 321 through gate valves, respectively.

The transfer chamber 321 is a depressurizable chamber and another transfer robot Rb2 is installed in the depressurizable chamber. The transfer robot Rb2 within the transfer chamber 321 is used and thus, process ST5 of method MT1, that is, transferring of the wafer W under vacuum environment may be performed.

The process modules PM1 and PM2 are connected to the transfer chamber 321 through corresponding gate valves, respectively. The transfer robot Rb2 takes out the wafer W from the load lock chamber LL1 or LL2 and sequentially transfers the wafer W to the process modules PM1 and PM2. The process module PM1 of the processing system 300 is a plasma processing apparatus and is an apparatus capable of performing processes ST1 to ST3. Further, the process module PM2 of the processing system 300 is a plasma processing apparatus and is an apparatus capable of performing process ST6.

Figure 9:
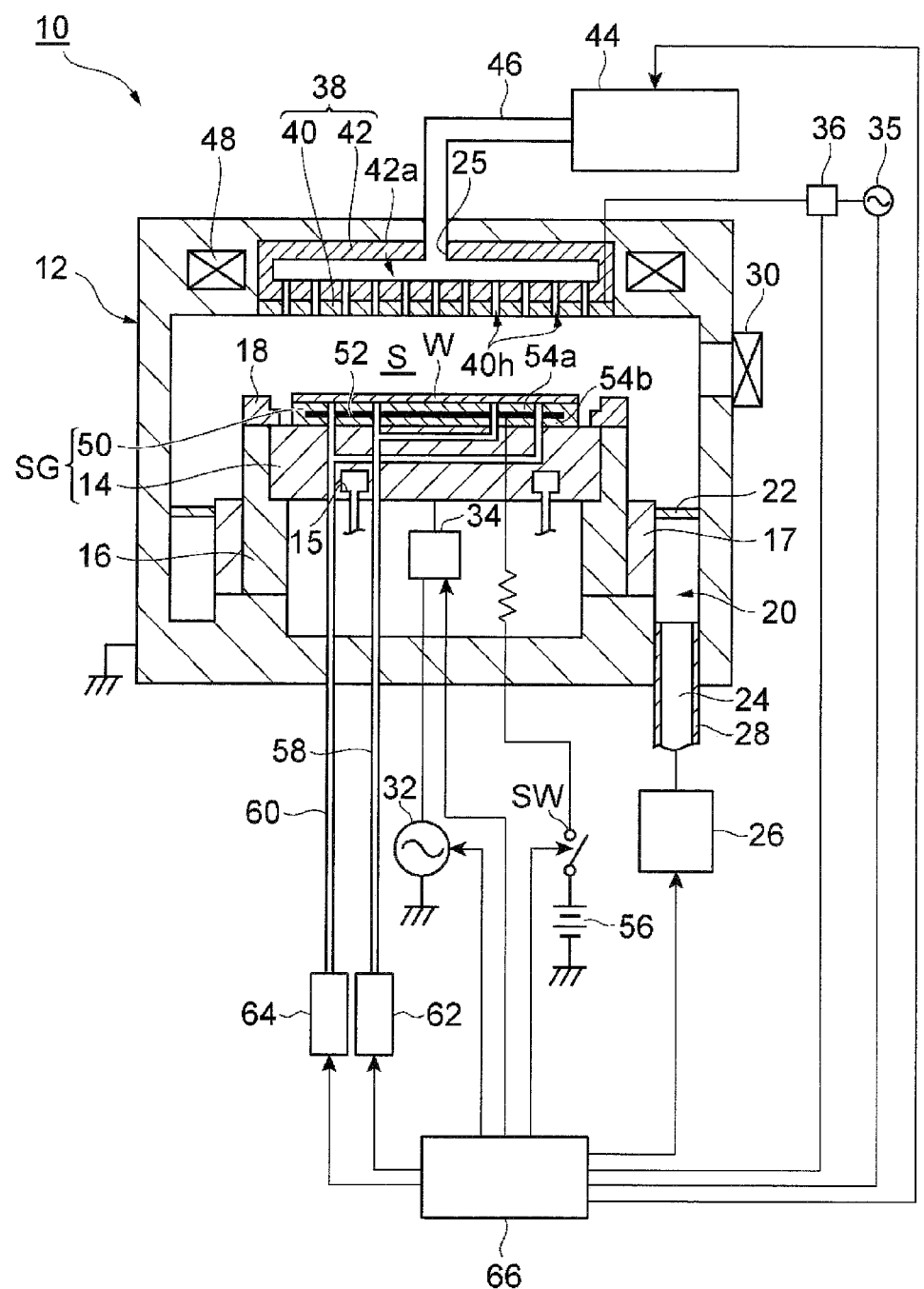
FIG. 9 is view schematically illustrating a plasma processing apparatus according to the exemplary embodiment.

FIG. 9 is view schematically illustrating a plasma processing apparatus according to an exemplary embodiment. In FIG. 9, a cross-sectional structure of a plasma processing apparatus 10 is illustrated. The plasma processing apparatus 10 illustrated in FIG. 9 may be used as the process module PM1 of the processing system 300.

The plasma processing apparatus 10 includes a processing container 12. The processing container 12 has substantially cylindrical shape and defines a processing space S as its internal space. The plasma processing apparatus 10 includes a placement table SG within the processing container 12. The placement table SG includes a substantially disk-shaped base 14 and an electrostatic chuck 50 that has a substantially disk shape. The base 14 is installed below the processing space S. The base 14 is made of, for example, aluminum, and constitutes a lower electrode. The base 14 has a function of absorbing heat of the electrostatic chuck 50 to be described below to cool the electrostatic chuck 50.

A coolant flow passage 15 is formed inside the base 14 and a coolant inlet piping and a coolant outlet piping are connected to the coolant flow passage 15. Also, it is configured such that an appropriate coolant, for example, cooling water, may be circulated in the coolant flow passage 15 using a chiller unit to control the base 14 and the electrostatic chuck 50 at a predetermined temperature.

Further, the plasma processing apparatus 10 further includes a cylindrical holding part 16 and a cylindrical supporting part 17. The cylindrical holding part 16 abuts the lateral surface and an edge portion of the bottom surface of the base 14 to hold the base 14. The cylindrical supporting part 17 extends from the bottom portion of the processing container 12 in a vertical direction and supports the base 14 through the cylindrical holding part 16. The plasma processing apparatus 10 further includes a focus ring 18 disposed on a top surface of the cylindrical holding part 16. The focus ring 18 may be made of, for example, silicon or quartz.

An exhaust passage 20 is formed between side walls of the processing container 12 and the cylindrical supporting part 17. A baffle plate 22 is attached to an inlet or on the way of the exhaust passage 20. Further, an exhaust port 24 is installed on the bottom portion of the exhaust passage 20. The exhaust port 24 is defined by the exhaust pipe 28 fitted in the bottom portion of the processing container 12. The exhaust device 26 is connected to the exhaust pipe 28. The exhaust device 26 has a vacuum pump and thus, the processing space S inside the processing container 12 may be depressurized to a predetermined vacuum level. Further, the gate valve 30 which opens and closes a carry-in/carry-out port of the wafer W is attached to a sidewall of the processing container 12.

A high frequency power source 32 which generates a high frequency bias power for ion attraction is electrically connected to the base 14 through a matching device 34. The high frequency power source 32 applies a high frequency bias power of, for example, 400 KHz, to a lower electrode, that is, the base 14.

The plasma processing apparatus 10 further includes a shower head 38 therein. The shower head 38 is installed above the processing space S. The shower head 38 includes an electrode plate 40 and an electrode support 42.

The electrode plate 40 is a conductive plate having a substantially disk shape and constitutes an upper electrode. A high frequency power source 35 for plasma generation is electrically connected to the electrode plate 40 through a matching device 36. The high frequency power source 35 applies a high frequency power of, for example, 60 MHz, to the electrode plate 40. When a high frequency power is applied to the base 14 and the electrode plate 40 by the high frequency power source 32 and the high frequency power source 35, high frequency electric field is formed in a space between the base 14 and the electrode plate 40, that is, the processing space S.

A plurality of gas vent holes 40h are formed in the electrode plate 40. The electrode plate 40 is detachably supported by the electrode support 42. The buffer chamber 42a is installed within the electrode support 42. The plasma processing apparatus 10 further includes a gas supply unit 44 and the gas supply unit 44 is connected to a gas introduction port 25 of a buffer chamber 42a through a gas supply conduit 46. The gas supply unit 44 supplies the processing gas into the processing space S. The gas supply unit 44 may supply a plurality of kinds of gases. In an exemplary embodiment, the gas supply unit 44 may selectively supply an Ar gas, a H2 gas, a methane gas and an NF3 gas to the shower head 38 through the gas supply conduit 46.

A plurality of holes each of which is continued to each of the plurality of gas vent holes 40h are formed in the electrode support 42 and the plurality of holes communicate with the buffer chamber 42a. Accordingly, a gas supplied from the gas supply unit 44 is supplied to the processing space S via the buffer chamber 42a and the gas vent hole 40h.

In the exemplary embodiment, a magnetic field formation mechanism 48 extending circularly or coaxially is installed on a ceiling portion of the processing container 12. The magnetic field formation mechanism 48 functions to facilitate start of high frequency discharge (ignition of plasma) at the processing space S to stably maintain discharge.

In the exemplary embodiment, the electrostatic chuck 50 is installed on the top surface of the base 14. The electrostatic chuck 50 includes an electrode 52 and a pair of insulation films 54a and 54b. The insulation films 54a and 54b are films formed by an insulator, such as ceramic. The electrode 52 is a conductive film and is installed between the insulation film 54a and the insulation film 54b. A DC power supply 56 is connected to the electrode 52 through a switch SW. When a DC voltage is applied to the electrode 52 from the DC power supply 56, a Coulomb force is generated and the wafer W is attracted and held on the electrostatic chuck 50 by the Coulomb force. A heater 53 which is a heating element is buried inside the electrostatic chuck 50 to heat the wafer W to a predetermined temperature. The heater is connected to a heater power supply through wiring.

The plasma processing apparatus 10 further includes gas supply lines 58 and 60 and heat transfer gas supply units 62 and 64. The heat transfer gas supply unit 62 is connected to the gas supply line 58. The gas supply line 58 extends to the top surface of the electrostatic chuck 50 to be extended annularly in a central portion of the top surface. The heat transfer gas supply unit 62 supplies a heat transfer gas, such as a He gas, into a space between the top surface of the electrostatic chuck 50 and the wafer W. Further, the heat transfer gas supply unit 64 is connected to the gas supply line 60. The gas supply line 60 extends to the top surface of the electrostatic chuck 50 to be extended annularly to surround the gas supply line 58 in the top surface. The heat transfer gas supply unit 64 supplies the heat transfer gas, such as a He gas, into the space between the top surface of the electrostatic chuck 50 and the wafer W.

In the exemplary embodiment, the plasma processing apparatus 10 further includes a control unit 66. The control unit 66 is connected to the exhaust device 26, the switch SW, the high frequency power source 32, the matching device 34, the high frequency power source 35, the matching device 36, the gas supply unit 44, and the heat transfer gas supply units 62 and 64. The control unit 66 transmits a control signal to each of the exhaust device 26, the switch SW, the high frequency power source 32, the matching device 34, the high frequency power source 35, the matching device 36, the gas supply unit 44, and the heat transfer gas supply units 62 and 64. Exhaust by the exhaust device 26, opening and closing of the switch SW, supplying of the high frequency bias power from the high frequency power source 32, impedance adjustment by the matching device 34, supplying of the high frequency bias power from the high frequency power source 35, impedance adjustment by the matching device 36, supplying of the processing gas by the gas supply unit 44, and supplying of the heat transfer gas according to each of the heat transfer gas supply units 62 and 64 are controlled by the control signal from the control unit 66.

In the plasma processing apparatus 10, an Ar gas is supplied from the gas supply unit 44 to the processing space S to be excited and thus, process ST1 may be performed. Further, the gas used at process ST1 may be a noble gas other than an Ar gas, or a gas other than the noble gas. Further, an NF3 gas is supplied from the gas supply unit 44 to the processing space S to be excited and thus, process ST2 may be performed. Further, other halogen-containing gas instead of NF3 may be used at process ST2. Further, at process ST2, a carbon-containing gas such as a methane gas and/or a noble gas such as an Ar gas may be supplied to the processing space S. Further, in the plasma processing apparatus 10, the methane gas is supplied from the gas supply unit 44 to the processing space S to be excited and thus, process ST3 may be performed. Further, at process ST3, other carbon-containing gas may be used, and a hydrogen gas may be contained in the gas to be supplied to the processing space S.

Figure 10:
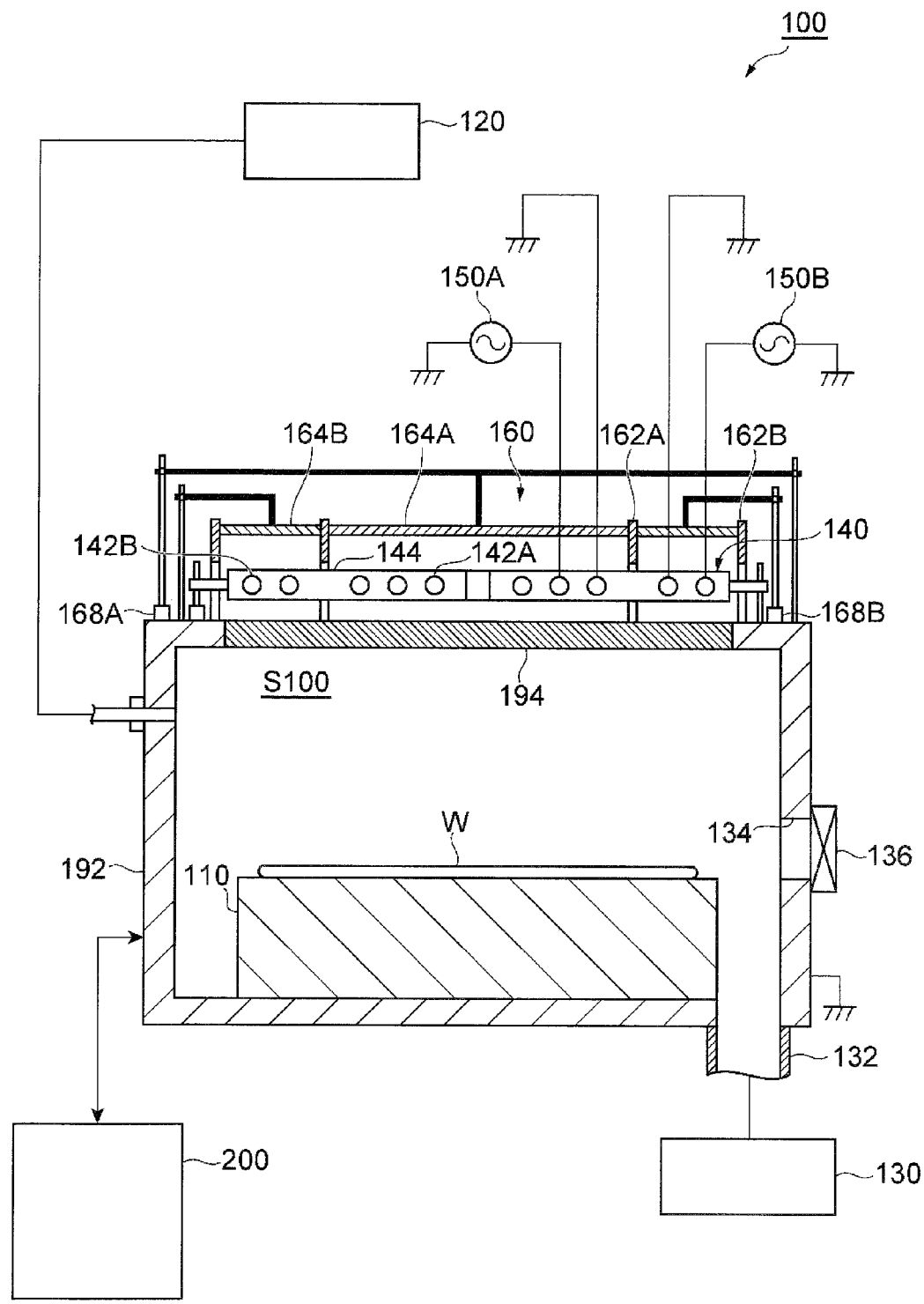
FIG. 10 is a view schematically illustrating the plasma processing apparatus according to the exemplary embodiment.
Figure 11:
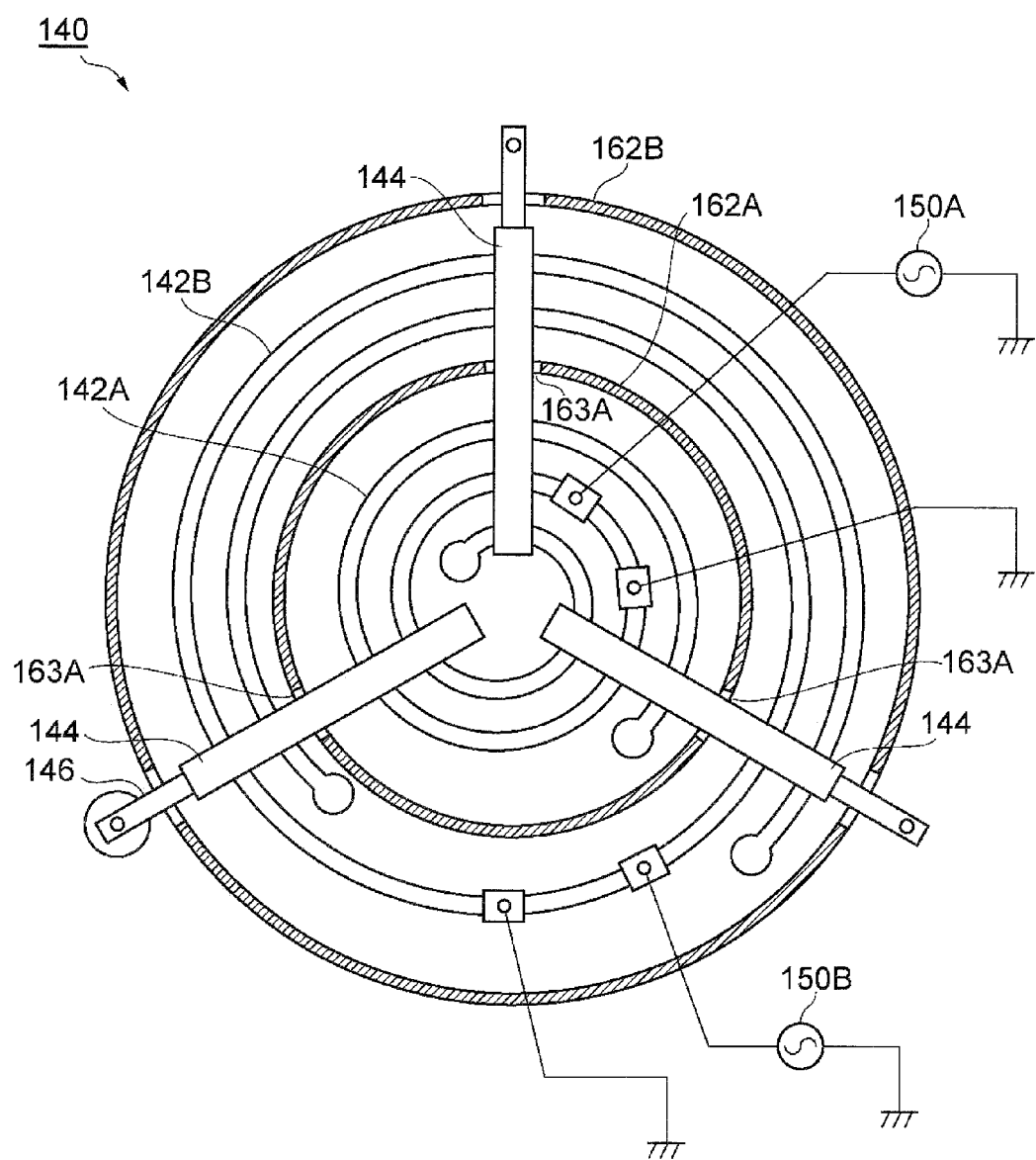
FIG. 11 is a plan view illustrating a high frequency antenna of the plasma processing apparatus illustrated in FIG. 10.

Subsequently, description will be made with reference to FIG. 10 and FIG. 11. FIG. 10 is a view schematically illustrating the plasma processing apparatus according to the exemplary embodiment. FIG. 11 is a plan view illustrating a high frequency antenna of the plasma processing apparatus illustrated in FIG. 10. The plasma processing apparatus 100 illustrated in FIG. 10 may be used as the process module PM2 of the processing system 300.

The plasma processing apparatus 100 includes a processing container 192 having a cylinder shape (e.g., a circular cylinder shape) and made of metal (e.g., aluminum). The processing container 192 defines a space S100 at its inside.

The placement table 110 for placing the wafer W is installed on the bottom portion of the processing container 192. The placement table 110 is made of, for example, aluminum, and formed in substantially a pillar shape (e.g., columnar shape). Further, various functionalities, such as an electrostatic chuck that attracts and holds the wafer W by a Coulomb force or a temperature adjustment mechanism such as a heater or a coolant flow passage are provided as needed in the placement table 110 as needed.

A plate-shaped dielectric 194 made of, for example, quartz, glass or ceramic is installed on the ceiling portion of the processing container 192 to be opposed to the placement table 110. For example, the plate-shaped dielectric 194 is formed in a disk shape and is air-tightly attached to cover an opening formed on the ceiling portion of the processing container 192.

The gas supply unit 120 is connected to the processing container 192. The gas supply unit 120 supplies a gas into a space S100. Specifically, the gas supply unit 120 supplies an Ar gas into the space S100. Further, the gas supply unit 120 may supply other noble gas instead of the Ar gas. Further, the gas supply unit 120 may supply a H2 gas into the space S100, in addition to the noble gas, in an exemplary embodiment.

An exhaust unit 130 which exhausts atmosphere within the processing container 192 is connected to the bottom portion of the processing container 192 through an exhaust pipe 132. The exhaust unit 130 is configured by, for example, a vacuum pump to depressurize inside the processing container 192 to a predetermined pressure.

The carry-in/carry-out port of the wafer W 134 is formed on the side wall of the processing container 192 and a gate valve 136 is formed on the carry-in/carry-out port of the wafer W 134. For example, upon carrying-in of the wafer W, the gate valve 136 is opened, the wafer W is placed on the placement table 110 within the processing container 192, and the gate valve 136 is closed and processing for the wafer W is performed.

A high frequency antenna 140 having a planar shape and a shield member 160 covering the high frequency antenna 140 are disposed at an upper surface (outer side surface) of the plate-shaped dielectric 194 on the ceiling portion of the processing container 192. The high frequency antenna 140 is configured by an inner antenna element 142A disposed on a central portion of the plate-shaped dielectric 194 and an outer antenna element 142B to surround a periphery of the inner antenna element when broadly dividing the high frequency antenna 140. Each of the antenna elements 142A and 142B may be formed of a spiral coil made of conductor such as copper, aluminum or stainless steel.

Both the antenna elements 142A and 142B are clamped by a plurality of clamping bodies 144 to be formed integrally. Each clamp body 144 is formed in, for example, a rod shape as illustrated in FIG. 11 and the clamping bodies 144 are disposed radially so as to project from a vicinity of the center of the inner antenna element 142A to outside of the outer antenna element 142B. FIG. 11 is a specific example of a case where each of the antenna elements 142A and 142B are clamped by three clamping bodies 144.

A shield member 160 includes an inner shield wall 162A disposed between the antenna elements 142A and 142B to surround the inner antenna element 142A and an outer shield wall 162B having a cylindrical shape and disposed to surround the outer antenna element 142B. Each of the inner shield wall 162A and the outer shield wall 162B has a cylindrical shape. Accordingly, the upper surface of the plate-shaped dielectric 194 is divided into a central portion (central zone) of inside of the inner shield wall 162A and a peripheral edge portion (peripheral edge zone) between the shield walls 162A and 162B.

An inner shield plate 164A having a disk shape is installed on the inner antenna element 142A to cover an opening of the inner shield wall 162A. An outer shield plate 164B having a doughnut plate shape is installed on the outer antenna element 142B to cover an opening between the shield walls 162A and 162B. Further, heights of the inner shield plate 164A and the outer shield plate 164B are adjusted independently by actuators 168A and 168B, respectively.

High frequency power sources 150A and 150B are connected to the antenna elements 142A and 142B, respectively. Accordingly, a high frequency power of the same frequency or different frequency may be applied to the antenna elements 142A and 142B. When a predetermined high frequency power of a predetermined frequency (e.g., 40 MHz) is applied to the inner antenna element 142A from the high frequency power source 150A, the gas introduced into the processing container 192 is excited by induced magnetic field formed within the processing container 192 and thus, plasma having a doughnut shape is generated over the central portion of the wafer W.

Further, when a predetermined high frequency power of a predetermined frequency (e.g., 60 MHz) is applied to the outer antenna element 142B from the high frequency power source 150B, the gas introduced into the processing container 192 is excited by induced magnetic field formed within the processing container 192 and thus, another plasma having a doughnut shape is generated over the peripheral edge portion of the wafer W.

The plasma processing apparatus 100 further includes a control unit 200. Each component of the plasma processing apparatus 100 is controlled by the control unit 200. The control unit 200 may control each component of the plasma processing apparatus 100 according to a process recipe of a desired process in order for the desired process to be performed in the plasma processing apparatus 100.

When process ST6 is performed in the plasma processing apparatus 100, a third gas containing a noble gas is supplied to the space S100 from the gas supply unit 120, an electrical power is supplied to the antenna elements 142A and 142B and induced magnetic field is formed in the space 5100. Accordingly, the third gas is excited in the space S100 to generate plasma. The wafer W is exposed to active species in the plasma so as to remove the deposit attached to the wafer W.

Hereinafter, descriptions will be made on Test Examples that were performed to evaluate the method MT1. The Test Examples to be described below was performed using a processing system 300.

Test Example 1, Test Example 2 and Comparison Test Example 1

In Test Example 1 and 2, a cycle of processes ST1 to ST3 of method MT1 was performed using the processing system 300. The wafer W used in Test Examples 1 and 2 was a wafer having a structure illustrated in FIG. 1 and the structure is configured by a CoPd film CP having a thickness of 20 nm, an upper electrode layer UE made of Ru having a thickness of 5 nm and a hard mask HM made of W (tungsten) having a thickness of 100 nm. In Test Example 1, the cycle including processes ST1 to ST3 was repeated 8 (eight) times under the following conditions, in a state where a temperature of the placement table was set to 10° C.

(Condition of Process ST1 in Test Example 1)
Pressure in the processing container: 10 mTorr (1.333 Pa)
High frequency power of the high frequency power source 35: 60 MHz, 300 W
High frequency bias power of the high frequency power source 32: 400 kHz, 300 W
$H_2$ gas: 410 sccm
$CH_4$ gas: 30 sccm
$SiF_4$ gas: 10 sccm
Processing time: 30 sec
(Condition of Process ST2 in Test Example 1)
Pressure in the processing container: 10 mTorr (1.333 Pa)
High frequency power of the high frequency power source 35: 60 MHz, 300 W
High frequency bias power of the high frequency power source 32: 400 kHz, 0 W
$CH_4$ gas: 50 sccm
$NF_3$ gas: 50 sccm
$SiF_6$ gas: 350 sccm
Processing time: 10 sec
(Condition of Process ST3 in Test Example 1)
Pressure in the processing container: 10 mTorr (1.333 Pa)
High frequency power of the high frequency power source 35: 60 MHz, 300 W
High frequency bias power of the high frequency power source 32: 400 kHz, 300 W
Ar gas: 100 sccm
$H_2$ gas: 320 sccm
$CH_4$ gas: 30 sccm
Processing time: 30 sec In Test Example 2, the cycle including processes ST1 to ST3 was repeated 10 (ten) times under the following conditions, in a state where a temperature of the placement table was set to −10° C.

(Condition of Process ST1 in Test Example 2)
Pressure in the processing container: 10 mTorr (1.333 Pa)
High frequency power of the high frequency power source 35: 60 MHz, 300 W
High frequency bias power of the high frequency power source 32: 400 kHz, 500 W
$H_2$ gas: 410 sccm
$CH_4$ gas: 30 sccm
$SiF_4$ gas: 10 sccm
Processing time: 30 sec
(Condition of Process ST2 in Test Example 2)
Pressure in the processing container: 10 mTorr (1.333 Pa)
High frequency power of the high frequency power source 35: 60 MHz, 300 W
High frequency bias power of the high frequency power source 32: 400 kHz, 0 W
Ar gas: 350 sccm
$CH_4$ gas: 50 sccm
$NF_3$ gas: 50 sccm
Processing time: 20 sec
(Condition of Process ST3 in Test Example 2)
Pressure in the processing container: 10 mTorr (1.333 Pa)
High frequency power of the high frequency power source 35: 60 MHz, 300 W
High frequency bias power of the high frequency power source 32: 400 kHz, 500 W
Ar gas: 100 sccm
$H_2$ gas: 320 sccm
$CH_4$ gas: 30 sccm
Processing time: 20 sec Further, a plasma processing was performed on the same wafer as that used in Test Examples 1 and 2 as Comparison Test Example 1 under the following conditions, in a state where a temperature of the placement table was set to 60° C.

Figure 12A:
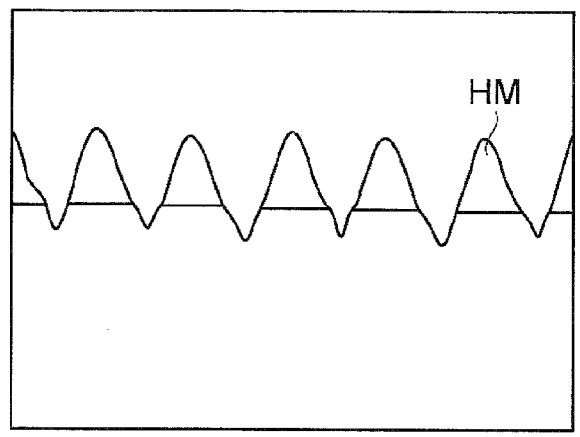
FIGS. 12A-12C are views representing results of Test Example 1, Test Example 2 and Comparison Test Example 1.
Figure 12B:
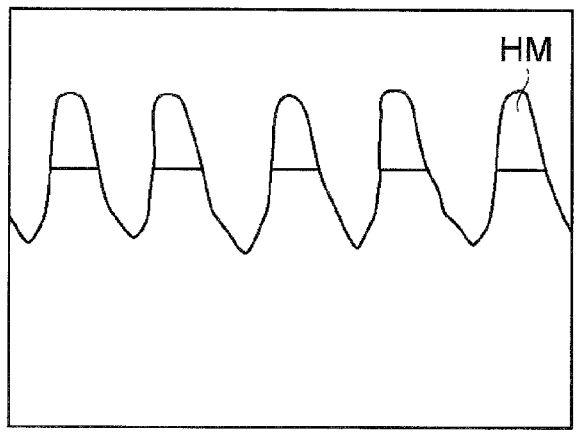
Figure 12C:
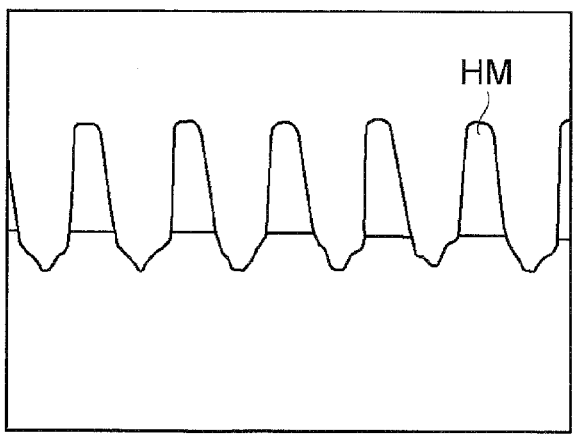

(Plasma Processing Condition of Comparison Test Example 1)
Pressure in the processing container: 30 mTorr (4 Pa)
High frequency power of the high frequency power source 35: 60 MHz, 800 W
High frequency bias power of the high frequency power source 32: 400 kHz, 1000 W
$CO_2$ gas: 80 sccm
$CH_4$ gas: 70 sccm
Processing time: 150 sec A SEM photograph of the wafer W was acquired after etching the CoPd film under the conditions described above in Test Example 1, Test Example 2 and Comparison Test Example 1. A diagram which outlines the wafer W represented in the SEM photograph is illustrated in FIG. 12. FIG. 12A illustrates a diagram of the wafer W in Comparison Test Example 1, FIG. 12B illustrates a diagram of the wafer W in Test Example 1 and FIG. 12C illustrates a diagram of the wafer W in Test Example 2. As illustrated in FIG. 12A, it was observed that verticality in the lateral surface of the hard mask HM was not maintained and a shoulder portion of the hard mask HM was completely lost in the processing performed at the temperature of 60° C., as a result of Comparison Test Example 1. In the meantime, as illustrated in FIG. 12B and FIG. 12C, it was observed that shoulder portion of the hard mask HM was maintained as results of Test Examples 1 and 2. Further, it was observed that verticality of the lateral surface of the hard mask HM was more efficiently maintained in Test Example 2 in which the processing was performed at the temperature of −10° C.

(Test Example 3, Comparison Test Examples 2 and 3)
Further, method MT1 was performed on the same wafer as that used in Test Example 1 under the following conditions. Further, the temperature of the placement table was set to −10° C. in processes ST1 to ST3 and the temperature of the placement table was set to 200° C. at process ST6. Further, the cycle of processes ST1 to ST3 was repeated 3 (three) times.

(Condition of Process ST1 in Test Example 3)
Pressure in the processing container: 30 mTorr (4 Pa)
High frequency power of the high frequency power source 35: 60 MHz, 100 W
High frequency bias power of the high frequency power source 32: 400 kHz, 300 W
Ar gas: 450 sccm
Processing time: 20 sec (Condition of Process ST2 in Test Example 3)
Pressure in the processing container: 30 mTorr (4 Pa)
High frequency power of the high frequency power source 35: 60 MHz, 100 W
High frequency bias power of the high frequency power source 32: 400 kHz, 0 W
Ar gas: 300 sccm
$CH_4$ gas: 100 sccm
$NF_3$ gas: 50 sccm
Processing time: 10 sec (Condition of Process ST3 in Test Example 3)
Pressure in the processing container: 30 mTorr (4 Pa)
High frequency power of the high frequency power source 35: 60 MHz, 100 W
High frequency bias power of the high frequency power source 32: 400 kHz, 200 W
$H_2$ gas: 430 sccm
$CH_4$ gas: 20 sccm
Processing time: 20 sec (Condition of Process ST6 in Test Example 3)
Pressure in the processing container: 1000 mTorr (133.3 Pa)
High frequency power of the high frequency power sources 150A and 150B: 40 MHz, 2000 W
Bias power for ion attraction: 0 W
Ar gas: 1100 sccm
$H_2$ gas: 135 sccm
Processing time: 180 sec Further, the same wafer W and the same conditions as those in Test Example 3 were used in Comparison Test Example 2, but the processing in Comparison Test Example 2 was ended before process ST3 of the last cycle. Further, in Comparison Test Example 3, the same wafer W and the same condition as those in Test Example 3 were used, but process ST6 was not performed.

Figure 13A:
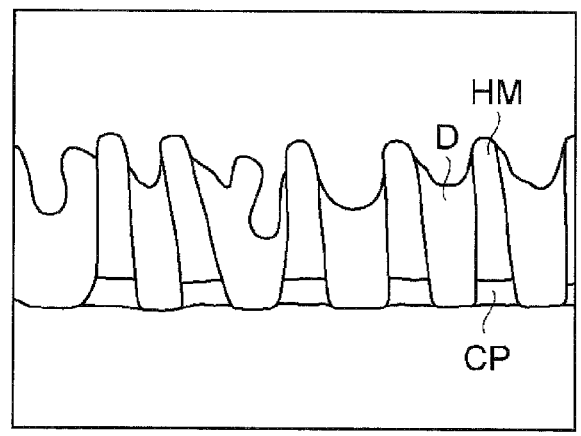
FIGS. 13A-13C are views representing results of Test Example 3, Comparison Test Example 2 and Comparison Test Example 3.
Figure 13B:
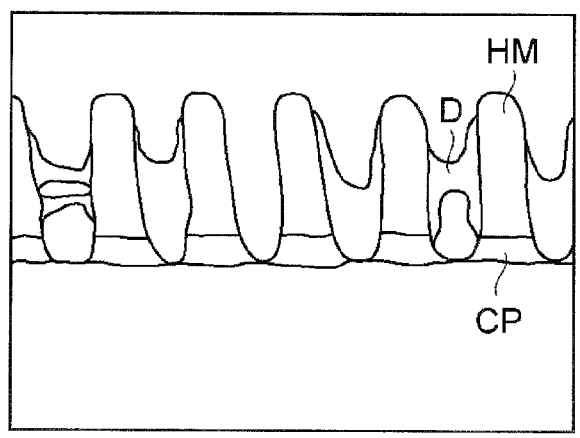
Figure 13C:
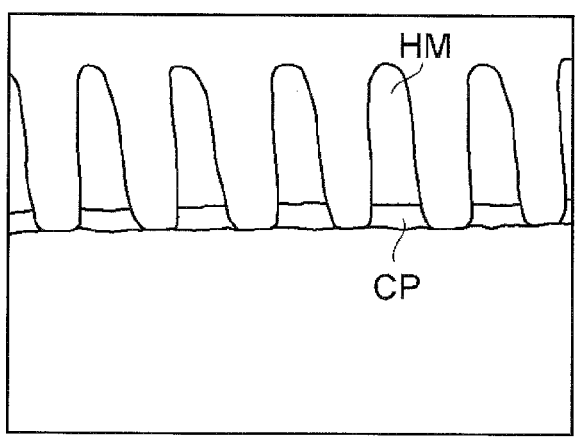

Also, the SEM photographs of the wafer W were acquired after performing the processing in each of Test Example 3 and Comparison Test Examples 2 and 3. A diagram which outlines the wafer W represented in the SEM photograph is illustrated in FIG. 13. FIG. 13A illustrates a diagram of the wafer W in Comparison Test Example 2, FIG. 13B illustrates a diagram of the wafer W in Comparison Test Example 3, and FIG. 13C illustrates a diagram of the wafer W in Test Example 3. As illustrated in FIG. 13A, it was observed that the deposit D was left at the periphery of the hard mask HM when the processing was ended before process ST3 of the last cycle, as a result of Comparison Test Example 2. Further, the deposit D illustrated in FIG. 13 was formed in such a manner that the halogenated deposit DFX attracts moisture at the time of acquisition the SEM photograph. Further, as illustrated in FIG. 13B, it was observed that when process ST6 was not performed, the deposit D was partially removed by the processing of process ST1 to process ST3 and thus, the amount of the deposit D was reduced, but the deposit D was still left, as a result of Comparison Test Example 3. In the meantime, as a result of Test Example 3, it was observed that the deposit was substantially completely removed from the periphery of the hard mask HM 3 as illustrated in FIG. 13C.

From the results described above of Test Example 3, Comparison Test Examples 2 and 3, it was observed that in the method MT1, the deposit may have been partially removed due to the cycle of processes ST1 to ST3, and the deposit may have been substantially and completely removed by performing the processing of the wafer under a relatively high temperature environment, at process ST6 after the cycle. Further, in Test Example 3, the pressure in the processing container at process ST6 was set to higher than the pressure in the processing container in processes ST1 to ST3. From this, it was observed that use of a relatively high pressure condition in process ST6 is efficient for removing the deposit.

From the foregoing, it will be appreciated that various exemplary embodiments of the present disclosure have been described herein for purposes of illustration, and that various modifications may be made without departing from the scope and spirit of the present disclosure. Accordingly, the various exemplary embodiments disclosed herein are not intended to be limiting, with the true scope and spirit being indicated by the following claims.

What is claimed is:

1. A method for etching a film, which contains cobalt and palladium and on which a hard mask is provided, of a workpiece, the method comprising:
a process of etching the film by ion sputter etching;
a process of exposing a workpiece to plasma of a first gas containing halogen elements after the process of etching the film;
a process of exposing the workpiece to plasma of a second gas containing carbons after the process of exposing the workpiece to the plasma of the first gas; and a process of exposing the workpiece to plasma of a third gas containing a noble gas after the process of exposing the workpiece to the plasma of the second gas, wherein a temperature of a placement table on which the workpiece is placed is set to a first temperature of 10° C. or less in the process of etching the film, the process of exposing the workpiece to the plasma of the first gas and the process of exposing the workpiece to the plasma of the second gas, and the temperature of the placement table on which the workpiece is placed is set to a second temperature higher than the first temperature in the process of exposing the workpiece to the plasma of the third gas.

2. The method for etching according to claim 1, wherein the first temperature is −10° C. or less.

3. The method for etching according to claim 1, wherein the third gas further contains a hydrogen gas.

4. The method for etching according to claim 1, wherein the process of etching the film, the process of exposing the workpiece to the plasma of the first gas, the process of exposing the workpiece to the plasma of the second gas are sequentially repeated, and subsequently the process of exposing the workpiece to the plasma of the third gas is performed.

* * * * *